(12) United States Patent  
Xiao et al.

(10) Patent No.: US 8,748,814 B1  
(45) Date of Patent: Jun. 10, 2014

(54) STRUCTURE FOR INSPECTING DEFECTS IN WORD LINE ARRAY FABRICATED BY SADP PROCESS AND METHOD THEREOF

(71) Applicant: Hermes Microvision Inc., Hsinchu (TW)

(72) Inventors: Hong Xiao, Pleasanton, CA (US); Jack Jau, Los Altos Hills, CA (US)

(73) Assignee: Hermes Microvision Inc., Hsinchu (TW)

( * ) Notice: Subject to any disclaimer, the term of this patent is extended or adjusted under 35 U.S.C. 154(b) by 0 days.

(21) Appl. No.: 13/826,015

(22) Filed: Mar. 14, 2013

(51) Int. Cl.  
*H01J 37/153* (2006.01)  
*G01R 31/02* (2006.01)

(52) U.S. Cl.  
USPC ........... 250/306; 250/307; 250/310; 382/145; 382/149; 700/110; 438/487

(58) Field of Classification Search  
USPC ............... 250/306, 307, 310; 382/149, 145; 438/487; 700/110  
See application file for complete search history.

(56) References Cited

U.S. PATENT DOCUMENTS

| | | | |
|---|---|---|---|
| 8,050,490 B2* | 11/2011 | Xiao et al. | 382/151 |
| 8,089,297 B2* | 1/2012 | Xiao et al. | 324/762.02 |
| 2012/0053723 A1* | 3/2012 | Richter | 700/110 |

* cited by examiner

*Primary Examiner* — Nikita Wells  
(74) *Attorney, Agent, or Firm* — WPAT, PC; Justin King

(57) ABSTRACT

This invention provides a test structure for inspecting word line array fabricated by SADP process, wherein the test structure comprises a contour circuit to cover one end of the WL array, and is alternatively float and ground to the word line array. The word line array then can be inspected by using E-beam inspection tool to identify open and short defects.

16 Claims, 11 Drawing Sheets

STRUCTURE FOR INSPECTING DEFECTS IN WORD LINE ARRAY FABRICATED BY SADP PROCESS AND METHOD THEREOF

CROSS-REFERENCE TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

FIELD OF THE INVENTION

The present invention generally relates to a structure for inspecting defects and method thereof, more particularly to a structure for inspecting defects in word line array fabricated by self-aligned double patterning (SADP) process and method thereof.

BACKGROUND OF THE INVENTION

Flash memory is a type of a non-volatile memory in which data can be stored even when power is turned off. Flash memory is typically made up of an array of floating gate transistors, commonly referred to as memory "cells." One or more bits of data are stored as charge by each memory cell. The flash memory can be electrically programmed and erased and does not need a refresh function of rewriting data at regular intervals. The term "program" refers to the operation of programming data into the memory cells and the term "erase" refers to the operation of erasing data from the memory cells. The flash memory device can be mainly classified into a NOR flash memory device and a NAND flash memory device depending on the structure of the cell and operation conditions. In the NOR flash memory device, the source of each memory cell transistor is connected to the ground terminal (VSS) to enable program and erase functions for a predetermined address. Accordingly, the NOR flash memory has been mainly used for application fields requiring the high-speed operation. On the other hand, in the NAND flash memory, a plurality of memory cells are connected in series to form one string. One string is connected to the source and drain. The NAND flash memory has been mainly used for high integration data retention related fields.

In the flash memory, bit lines are typically formed in the portion of the semiconductor substrate that is below the charge trapping structure and word lines may be formed from the layer of electrically conductive material that is disposed on the charge trapping structure. This arrangement enables flash memory cells to be manufactured efficiently and economically. Various semiconductor fabrication processes use masks to help align the memory cells. Aligning the cells produces a more organized and compact design. Although masking techniques properly align the cells, scaling becomes an issue. It becomes harder to place the cells closer together. It is important to place the cells as close together without impacting their functionality because denser cells can hold more data for a given semiconductor area. In other words, tighter tolerances allow for greater memory capacity at reduced cost.

Another issue unavoidably arises as denser cells are fabricated. For example, much denser word line array with tiny pitch of the flash memory is hard to fabricate and inspect. FIG. 1 shows a schematic view of word line array of NAND flash memory. As the pitch between adjacent word lines decreases, the probability of present of short and open defects as well as the difficulty of detect the defects also increases. Therefore, there is a need for identify and detect defects present in word line array with dense pitch

BRIEF SUMMARY OF THE INVENTION

The present invention generally relates to a structure for inspecting defects in conductive line array and method thereof through alternatively floating and grounding the conductive line array by a contour circuit connecting one of every two adjacent conductive lines of the conductive line array. The contour circuit will be removed after inspection process. The conductive line array and the contour circuit are formed simultaneously so that dense conductive line array can be easily and effectively inspected by using inspection tool to identify short and open defects.

One embodiment of the present invention provides a test structure with a contour circuit covering one end of the conductive line array and alternatively floating and grounding the conductive line array by connecting one of every two adjacent conductive lines of the conductive line array. Thus any short defect between any two conductive lines of the conductive line array or open defect of one conductive line of the conductive line array can be identified in an inspection process such as E-beam inspection process.

The present invention also provides a method for simultaneously forming conductive line array to be inspected and the contour circuit for detecting defect in the conductive line array of a device. The conductive line array and the contour circuit are formed by a self-aligned double patterning process wherein the contour circuit covers one end of the conductive line array and alternatively floating and grounding the conductive line array by connecting one of every two adjacent conductive lines of the conductive line array so that defect can be identified in an inspection process.

DETAILED DESCRIPTION OF THE INVENTION

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well known process operations are not described in detail in order not to unnecessarily obscure the present invention.

The present invention generally relates to a structure for inspecting defects and method thereof, more particularly to a structure with a contour circuit as test structure for inspecting defects in word line array fabricated by self-aligned double patterning (SADP) process and method thereof. Present invention provides a structure fabricated with word line array for inspecting defects therein and can be removed to complete fabrication of device after testing and defect inspection. Merely by way of example, the invention has been applied to defect inspection of word line array of NAND device by a scanning electron beam inspection system. But it would be recognized that the invention could be applied to defect inspection of other device by charged particle beam as an observation tool.

Figure 1:
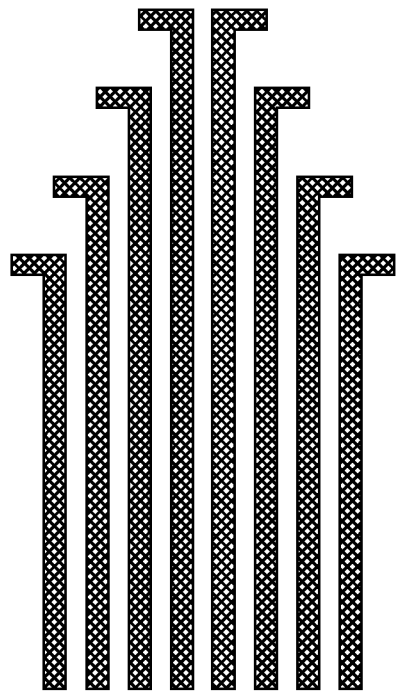
FIG. 1 is a schematic view of word line array of NAND flash memory.
Figure 2:
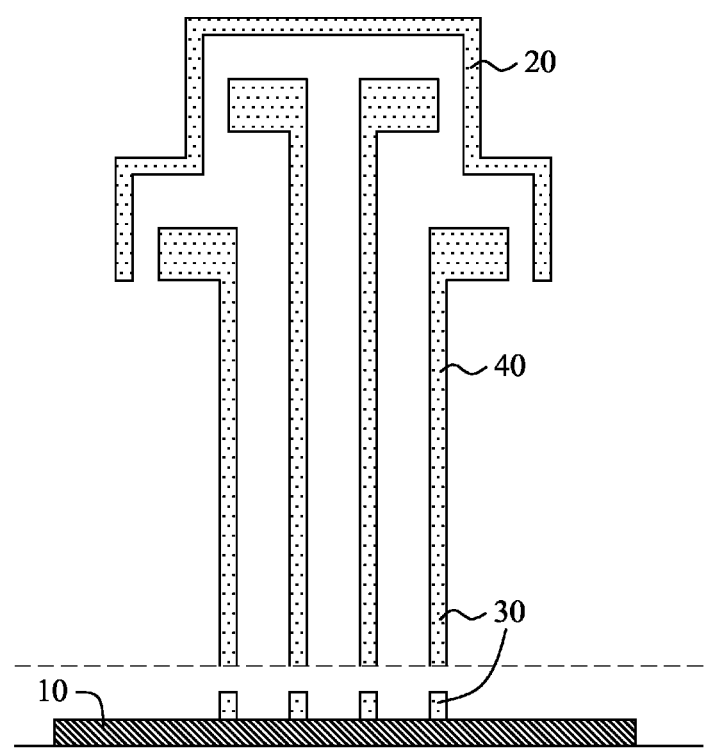
FIG. 2 is a schematic view showing a photoresist pattern formed on a conductive layer according to an embodiment of present invention.

Referring to FIG. 2, a schematic view showing a photoresist pattern 20 formed on a conductive layer 10 is shown. The conductive layer comprises a stack of polysilicon layer and metal for forming conductive line array on a substrate. The photoresist pattern 20 is formed on the conductive layer 10 via a photolithography process with a first mask of self-aligned double patterning process. The photoresist pattern 20 includes a contour portion 20 and line portions 30. The contour portion 20 including pad portions 40 is formed related to a contour circuit as test structure while the line portions 30 is formed related to a conductive line array such as a word line array, and more preferably a word line array of NAND memory device. The contour circuit is used to alternatively float and ground the conductive line array so that the conductive line array can be easily and effectively inspected by using inspection tool such as E-beam inspection tool to identify short and open defects. The details of the contour circuit and the use of the contour circuit for inspecting the conductive line array to identify short and open defects by using inspection tool will be described in the following description.

Figure 3:
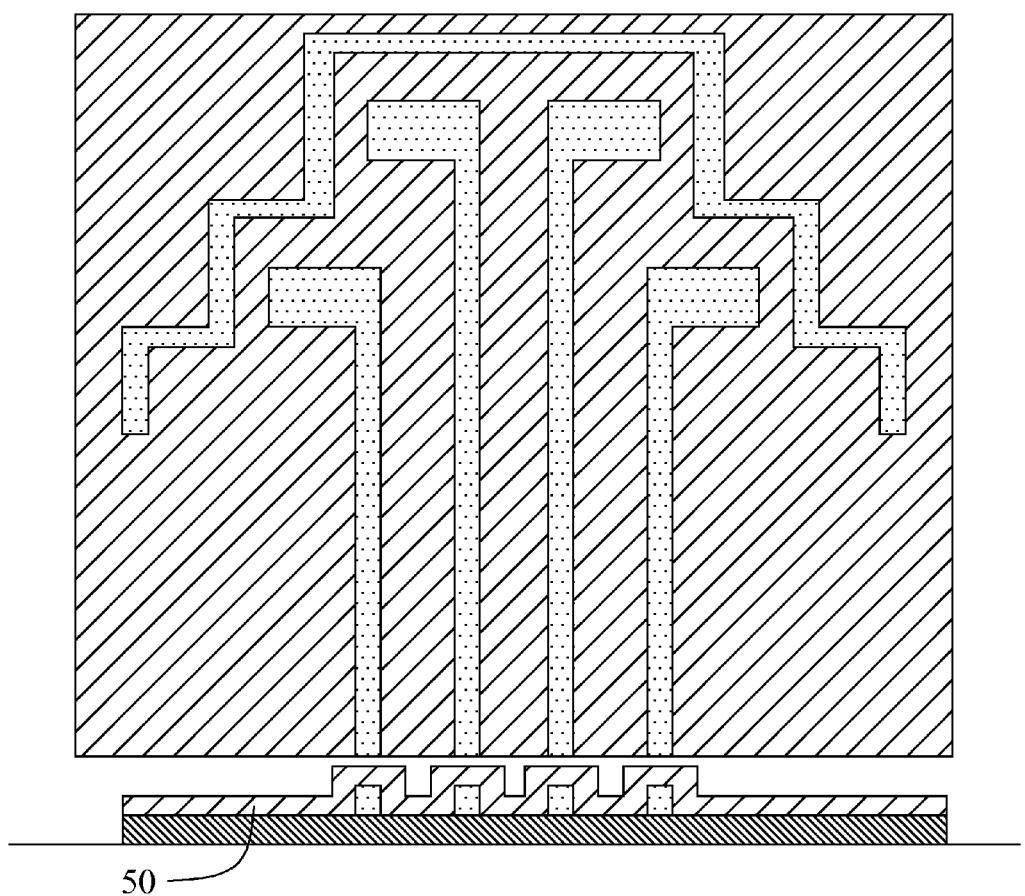
FIG. 3 s a schematic view showing a spacer film conformally formed over the conductive layer and the photoresist pattern.

FIG. 3 shows a schematic view of a spacer film 50 conformally formed over the conductive layer 10 and the photoresist pattern 20. The spacer film 50 is used to formed spacer of the photoresist pattern 20, particularly spacer of the contour portion 20 and the line portions 30. Since the spacer film 50 is used to form as spacer adjacent the photoresist pattern 20, sidewall step coverage of the material of the spacer film 50 must be good enough or the best. The spacer film 50 can be made of organic oxide with good step coverage, such as TEOS oxide. The spacer film 50 can be formed any known process with low temperature particularly lower than the photoresist layer used to form the photoresist pattern 20. For example, a chemical vapor deposition (CVD) process with a temperature lower than 100° C. to form an oxide spacer film can be used. The spacer film 50 can also be formed of CVD α-carbon, nitride, oxide and oxynitride.

Figure 4:
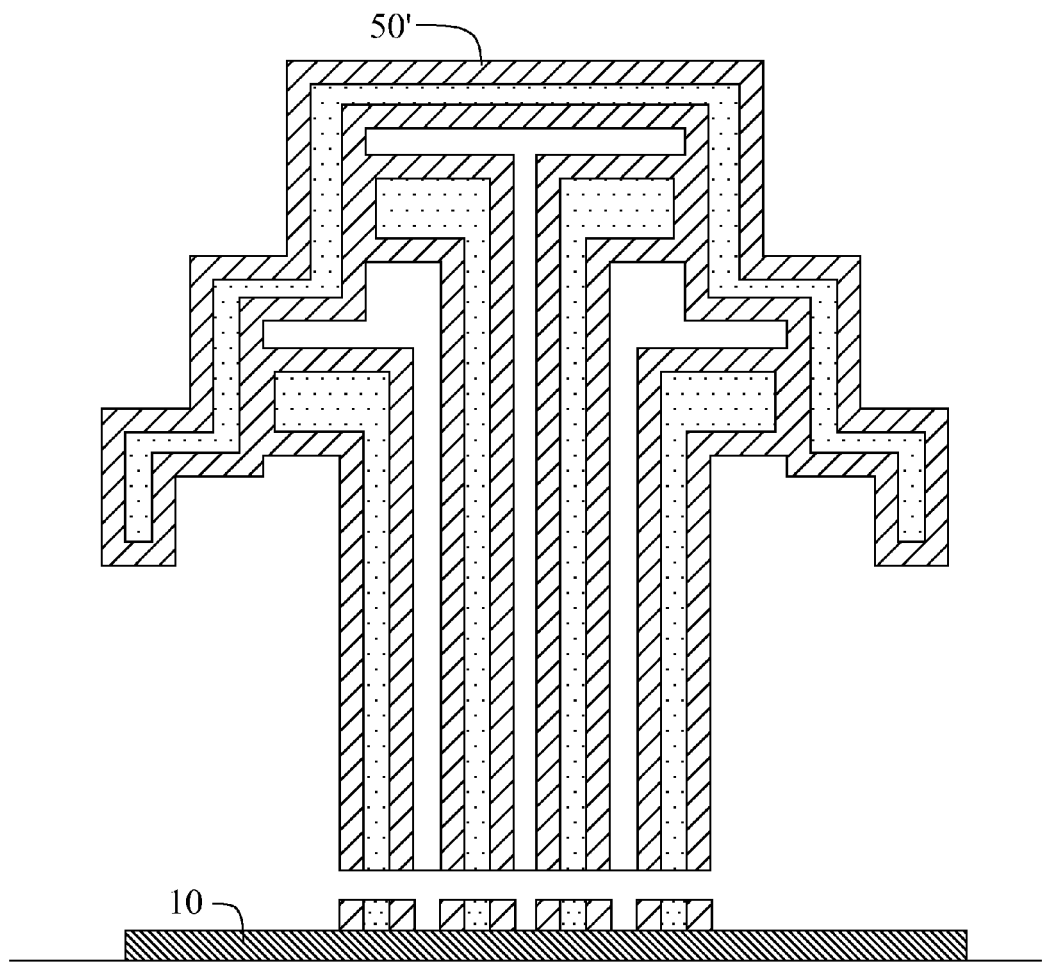
FIG. 4 is a schematic view showing spacer formed adjacent the photoresist pattern.

In order to form hard mask for forming both conductive line array and contour circuit, the spacer film 50 is then etched. Referring to FIG. 4, a schematic view of spacer 50' adjacent the photoresist pattern 20 is shown. Referring to FIG. 3, the spacer 50' is formed by etching the spacer film 50. The etching of the spacer film 50 can be performed by any suitable etching process for etching the material with good step coverage formed at low temperature.

Figure 5:
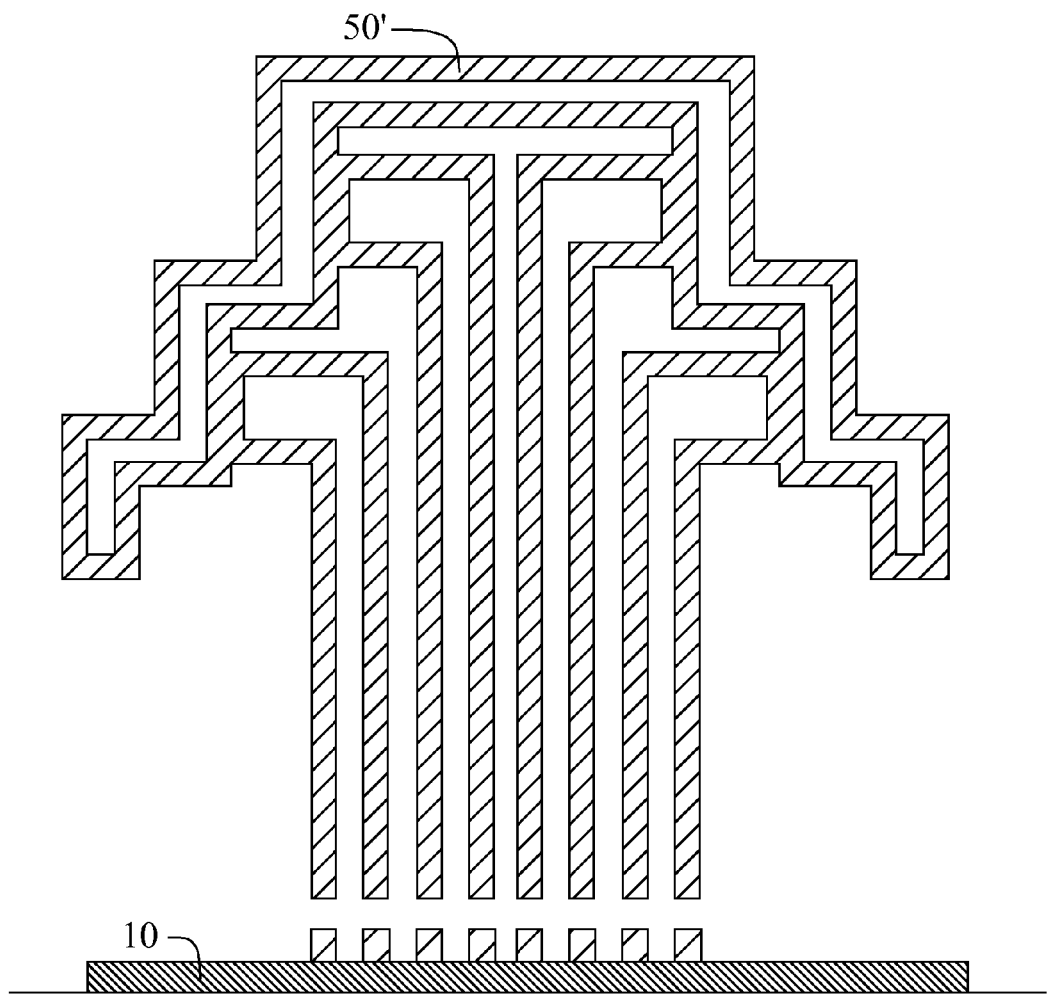
FIG. 5 is a schematic view showing the spacer on the conductive layer after the photoresist pattern is stripped.
Figure 6:
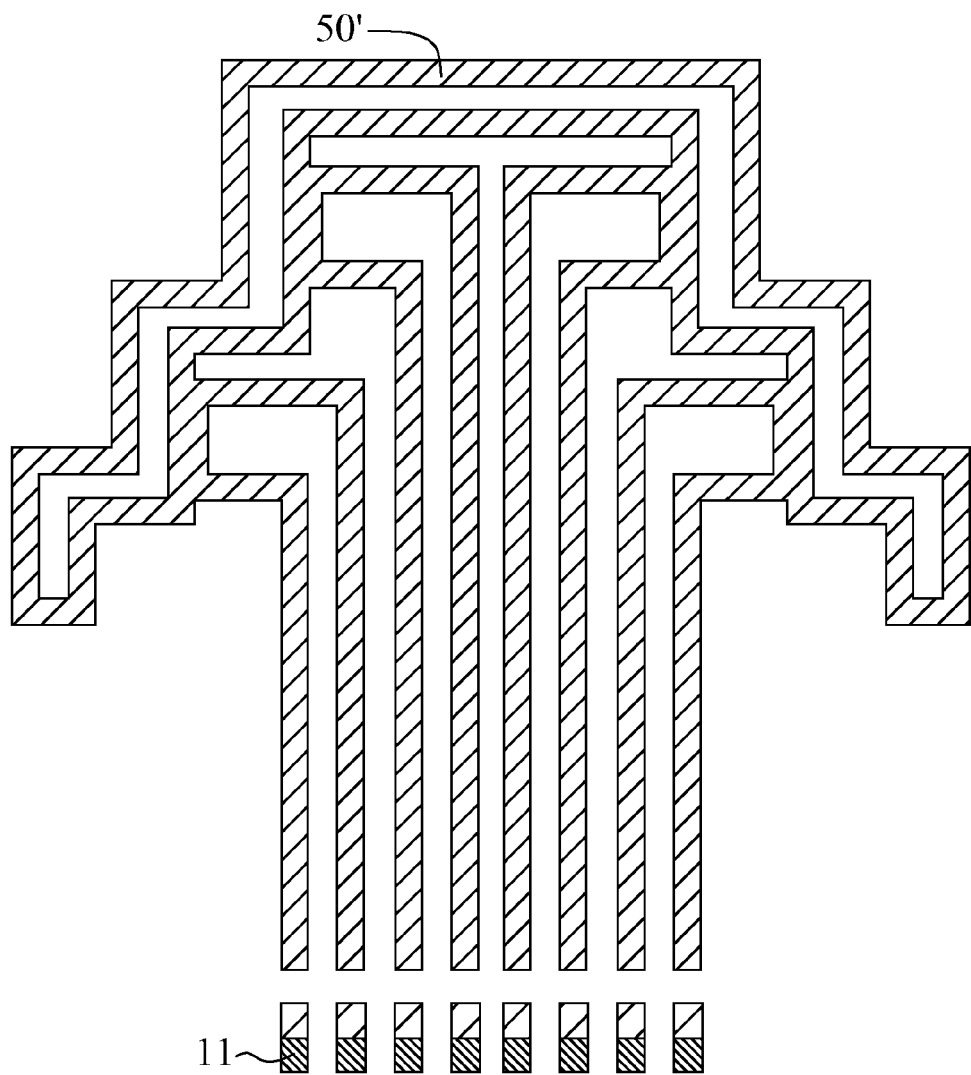
FIG. 6 is a schematic view showing the result of etching the conductive layer to form conductive line array and contour circuit by using the spacer as etching mask.

FIG. 5 shows the spacer 50' on the conductive layer 10 after the photoresist pattern 20 is stripped while FIG. 6 shows the result of etching the conductive layer 10 to form conductive line array and contour circuit by using the spacer 50' as etching mask. The photoresist pattern 20 can be removed via oxygen plasma which will harden the oxide spacer simultaneously if the spacer 50' is oxide spacer. The conductive layer 10 can be etched by Cl-based plasma etching and F-based plasma etching if the conductive layer is a stack of polysilicon layer and metal. The polysilicon layer can be etched by Cl-based plasma while the metal can be etched by F-based plasma. The stripping of the photoresist pattern 20 shown in FIG. 5 and the self-aligned etching of the conductive layer 10 in FIG. 6 can be performed simultaneously.

Figure 7:
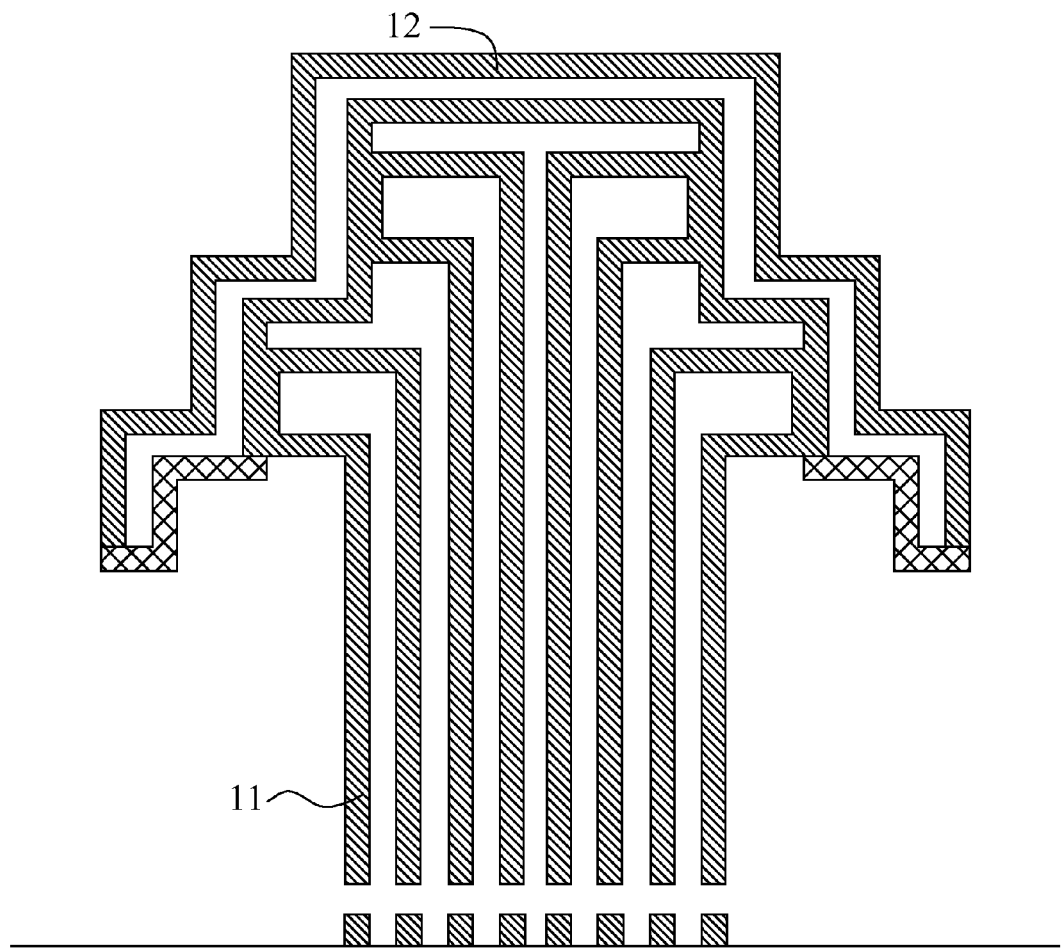
FIG. 7 is a schematic view showing conductive line array and contour circuit after the spacer thereon is removed.
Figure 8:
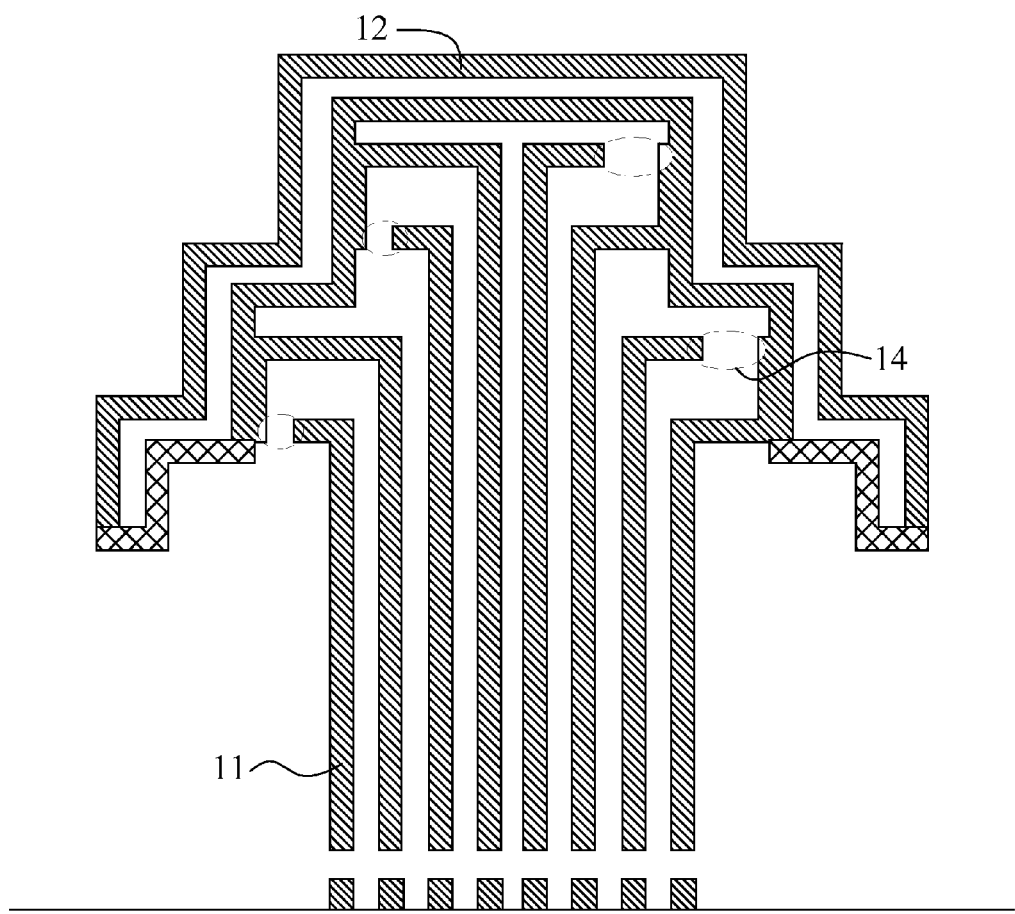
FIG. 8 is a schematic view of the contour circuit connecting one of every two conductive line of the conductive line array as the test structure according one embodiment of the invention.

FIG. 7 shows conductive line array 11 and contour circuit 12 after the spacer 50' thereon is removed. The spacer 50' as a hard mask can be stripped by suitable etching process for the spacer 50' depending on the material selected which meets the requirements of good step coverage formed at low temperature. As shown in FIG. 7, the contour circuit 12 connects one end of the conductive line array 11. However, in order to alternatively float and ground the conductive line array 11 thereby a short defect between any two conductive lines of the conductive line array or an open defect of one conductive line of the conductive line array can be identified in an inspection process such as E-beam inspection, the connection between one of every two conductive line and the contour circuit 12 must be removed. In order to complete the test structure, a photolithography process with a second mask is performed. FIG. 8 shows a schematic view of the contour circuit 12 connecting one of every two conductive line of the conductive line array 11 as the test structure according one embodiment of the invention. As shown in FIG. 8, only one of two adjacent conductive line of the conductive line array 11 connects to the contour circuit 12, while the other conductive line disconnects the contour circuit 12 with a pitch 14 large enough to ensure that the conductive line can be floated to show image contrary to that of the conductive line connecting to the contour circuit 12 in an inspection process. It is noted that the configuration or arrangement of the conductive lines of the conductive line array 11 alternatively connecting to the contour circuit 12 is only an example, not a limitation, any other configuration of the conductive lines which can render the conductive lines easy to be identified in inspection process can be used. It will be appreciated by those skilled in the art that various modifications may be made without departing from the scope of the present invention, which is intended to be limited solely by the appended claims. The photolithography process can be an optical photolithography process with the second mask.

Figure 9:
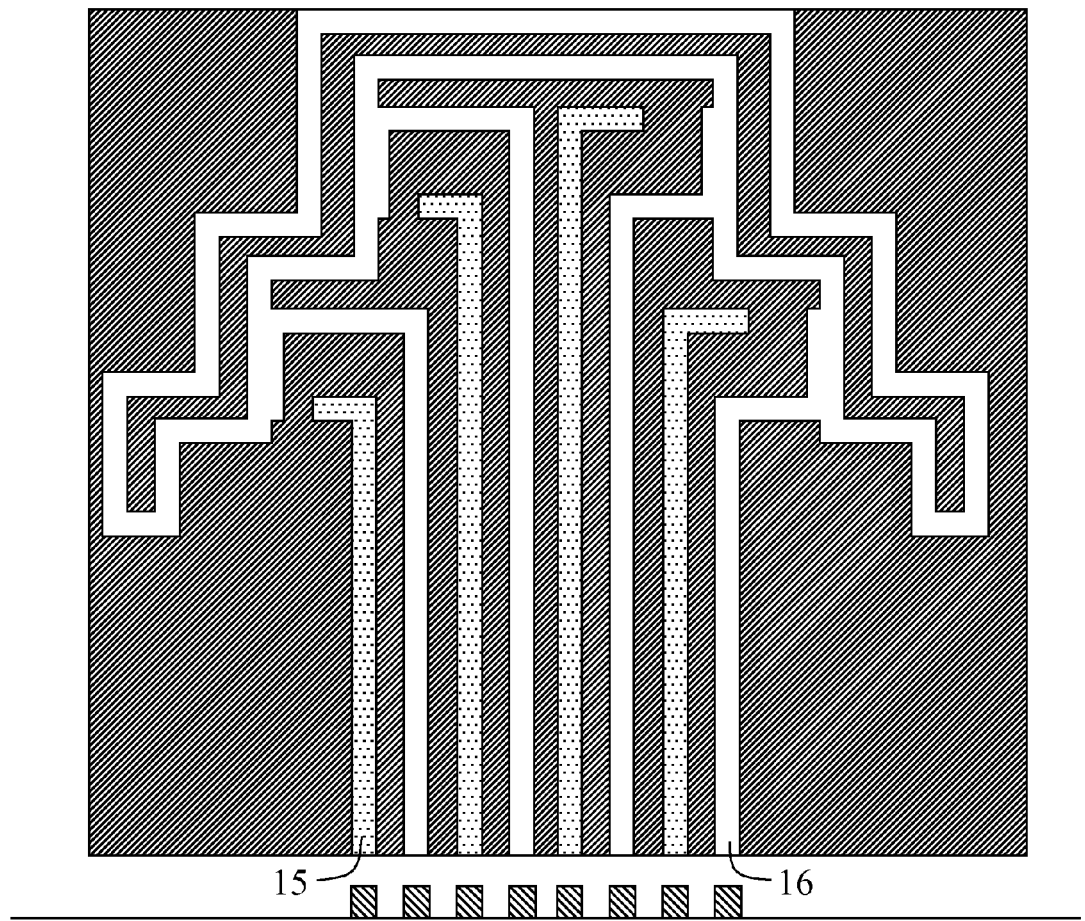
FIG. 9 is a schematic view showing an normal image in gray level contrast of E-beam inspection of the test structure in FIG. 8 according one embodiment of the invention.

FIG. 9 shows a normal image in gray level contrast of E-beam inspection of the test structure in FIG. 8 according one embodiment of the invention. E-beam inspection is performed by scanning an electron beam over the surface patterns of devices formed on the substrate, and collecting the secondary electrons emanated from the surface patterns of scanned devices as inspection signals. The signals are processed and represented in gray levels to produce images of surface patterns of the scanned devices. The obtained image shown in gray level contrast represents the difference in electrical charging voltages associated with the devices, connections, as well as the materials. The image is thus also known as a voltage contrast (VC) image. Abnormal gray levels, or say abnormal VCs, are detected to identify defective devices or connections. For example, if a bright gray level shows up where a darker gray level should have been observed, it is deemed there is a bright voltage contrast (BVC) defect. On the other hand, if a dark gray level shows up where a brighter gray level should have been observed, it is deemed that there exists a dark voltage contrast (DVC) defect. Referring back to FIG. 9, the image 15 of the conductive line which disconnects the contour circuit 12 or is floated shows a bright gray level image, while the image 16 of the conductive line which connects the contour circuit 12 or is grounded shows a dark gray level image. However, since the charging induced and accumulated on the test structure can be negative or positive and thus leading to different imaging mode, depending on the electron beam conditions (landing energy, beam current, etc) used, the different imaging mode may lead to different voltage contrast images for test structure shown in FIG. 8. For example, the image 15 of the conductive line which disconnects the contour circuit 12 may appear relatively dark due to excessive positive charging accumulated. On the other hand, the image 16 of the conductive line which connects the contour circuit 12 may appear relatively bright due to the formed release path of charging.

Figure 10:
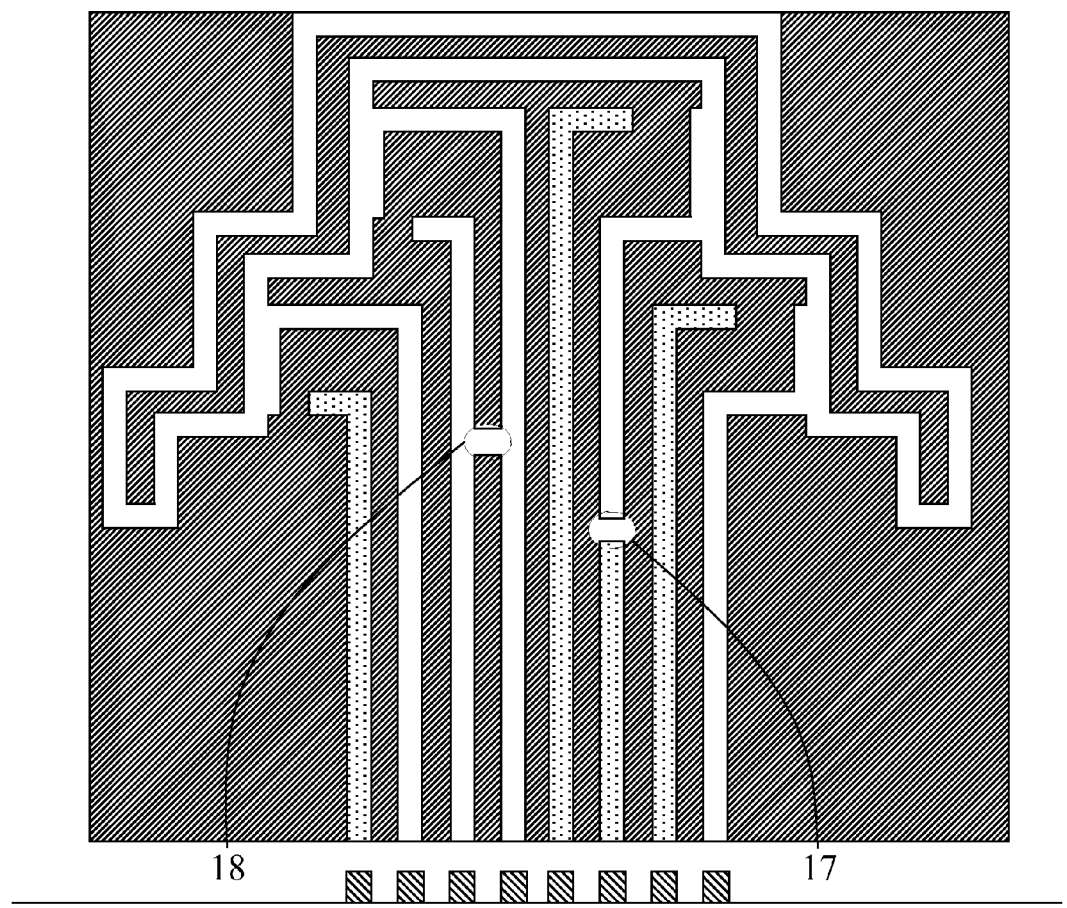
FIG. 10 is a schematic view showing an image with defects in gray level contrast of E-beam inspection of the test structure according one embodiment of the invention.

FIG. 10 shows an image with defects in gray level contrast of E-beam inspection of the test structure according one embodiment of the invention. In the example image, an image 17 of open defect between two adjacent conductive lines and an image 18 of short defect between two adjacent conductive lines are shown. Depending on the electron beam conditions, if the electron beam is scanned over the test structure and induces negative charging on the test structure, the image 17 of open defect shows a dark gray level image on the upper half conductive line and a bright gray level image on the lower half conductive line, while the image 18 of short defect shows a dark gray level image of two adjacent conductive lines with a short connection therebetween. Comparing to the normal image in gray level contrast of the test structure shown in FIG. 9, the short and open defects present in the test structure can be easily identified through the change of gray level image of conductive line which is expected to be floated or grounded. If positive charging is induced on the test structure, the image 17 of open defect shows a bright gray level image on the upper half conductive line and a dark gray level image on the lower half conductive line, while the image 18 of short defect shows a bright gray level image of two adjacent conductive lines with a short connection therebetween. Nevertheless, no matter which or what kind of imaging mode is used, the short and open defects present in the test structure can be always identified through the contrary gray level images of adjacent conductive lines.

The inspection tool used to generate gray level image of the test structure is preferably an E-beam inspection tool. A typical E-beam inspection tool includes a charged particle source for generating a primary particle beam onto specimen, a condenser lens for pre-focusing the primary charged particle beam, a detection system for detecting charged particles emanated from the specimen by the impingement of focused primary charged particle beam on the specimen, a deflection system for deflecting the primary charged particle beam over the specimen to form a scanning pattern, an alignment unit for aligning the optical axis of the charged particle beam released from the specimen with the optical axis of the primary charged particle beam, and a stage for moving the specimen to the axial area and adjusting the specimen height to the focused-imaging plane of the primary charged particle beam along X, Y and Z directions. However, this inspection tool set forth is only an example, not a limitation, other inspection tool can also be used and one of ordinary skill in the art would recognize many variations, alternatives, and modifications.

Comparing to the use of a structure for inspecting defects formed together with conductive lines on the semiconductor substrate of the present invention, conventional defect inspection of a semiconductor substrate with devices such as flash memory is performed by comparing a sample substrate and a substrate to be inspected. In order to provide comparison with a normal device on the substrate to be inspected, possible defects are deliberately formed on the sample substrate and images of the defects are used as contrasts. The defect inspection of the substrate to be inspected is performed through comparing the image of the substrate to be inspected generated by an inspection tool and the images of the defects of the sample substrate. Thus conventional defect inspection requires additional sample substrate and inspecting steps comparing to the present invention.

Figure 11:
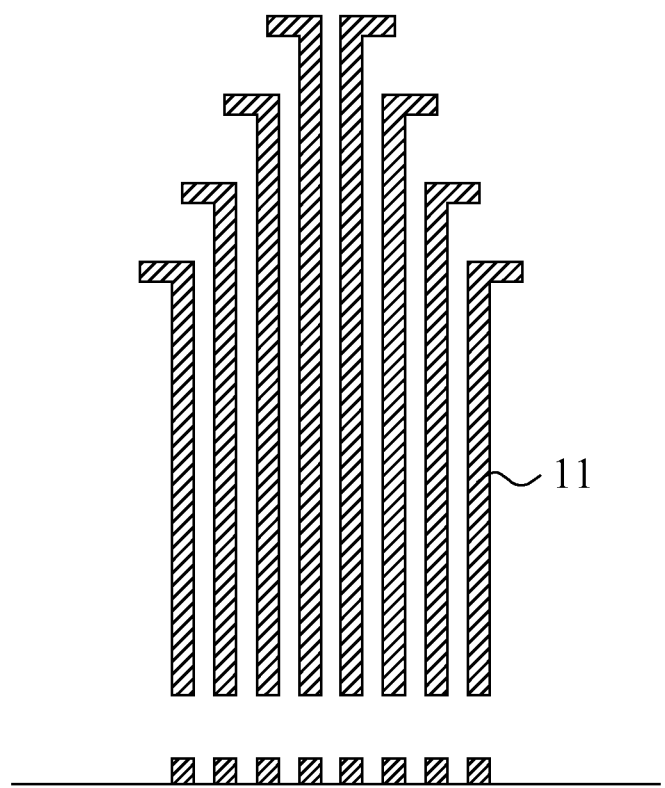
FIG. 11 is a schematic view showing the conductive line array after the contour circuit is removed.

The contour circuit of the test structure originally formed to alternatively float and ground the conductive line array so that the conductive line array can be easily and effectively inspected by using inspection tool to identify short and open defects should removed to complete the fabrication of normal device. As shown in FIG. 11, the conductive line array is shown after the contour circuit is removed. Comparing to the test structure including the conductive line array 11 and the contour circuit 12 shown in FIG. 8, the contour circuit 12 and the connections between the conductive line array 11 and the contour circuit 12 are removed. The contour circuit 12 and the connections between the conductive line array 11 and the contour circuit 12 can be removed by a photolithography process and a third mask. The photolithography process can be an optical photolithography process with the third mask.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A test structure for a conductive line array of a device, comprising:
    a contour circuit on a substrate to be inspected covering one end of the conductive line array on the substrate and alternatively floating and grounding the conductive line array, thereby a short defect between any two conductive line of the conductive line array or an open defect of one conductive line of the conductive line array can be identified in an inspection process.

2. The test structure according to claim 1, wherein the conductive line array of the device comprises word line array of NAND flash memory.

3. The test structure according to claim 1, wherein the contour circuit is fabricated by a self-aligned double patterning process.

4. The test structure according to claim 1, wherein the inspection process comprises an E-beam inspection process.

5. The test structure according to claim 1, wherein the contour circuit connects one of every two adjacent conductive lines of the conductive line array.

6. The test structure according to claim 1, wherein the contour circuit and the conductive line array comprises a stack of polysilicon layer and metal layer.

7. An inspection tool, comprising:
- a charged particle source for generating a charged particle beam;
- a detection system for detecting charged particles emanated; and
- a substrate with a test structure thereon including an contour circuit covering one end of a conductive line array and alternatively floating and grounding the conductive line array, thereby a short defect between any two conductive line of the conductive line array or an open defect of one conductive line of the conductive line array can be identified in an inspection process through the impingement of the charged particle beam on the substrate and the detection of charged particles emanated from the test structure.

8. The inspection tool according to claim 7, the inspection tool includes an E-beam inspection tool.

9. The inspection tool according to claim 7, further comprising
- a condenser lens for focusing the charged particle beam;
- a deflection system for deflecting the primary charged particle beam over the substrate to form a scanning pattern;
- an alignment unit for aligning the optical axis of the charged particle beam released from the substrate with the optical axis of the primary charged particle beam; and
- a stage for moving the specimen to the axial area and adjusting the substrate height to the focused-imaging plane of the primary charged particle beam along X, Y and Z directions.

10. A method for detecting a conductive line array of a device, comprising:
- providing a conductive layer on a substrate;
- forming a patterned photoresist layer on the substrate;
- depositing a conformal film on the patterned photoresist layer and the conductive layer;
- blanket etching the conformal film to form spacers on sidewalls of the patterns photoresist, wherein the spacers include a conductive line array pattern and a contour circuit pattern covering one end of the conductive line array;
- removing the patterned photoresist layer;
- etching the conductive layer by using the spacers as a mask to form the conductive line array and a contour circuit covering the end of the conductive line array;
- removing the spacers; and
- removing a plurality of portions of the contour circuit such that the conductive line array is alternatively floated and grounded, thereby a short defect between any two conductive line of the conductive line array or an open defect of any one conductive line of the conductive line array can be identified in an inspection process.

11. The method according to claim 10, further comprising a step of removing the contour circuit.

12. The method according to claim 10, wherein the conductive layer comprises a stack of polysilicon layer and metal layer.

13. The method according to claim 10, wherein the conductive line array of the device comprises word line array of NAND flash memory.

14. The method according to claim 10, wherein the conformal film comprises a low temperature oxide film.

15. The method according to claim 10, wherein the conformal film comprises a TEOS oxide film.

16. The method according to claim 10, wherein the contour circuit connects one of every two adjacent conductive lines of the conductive line array.

* * * * *